United States Patent [19]

Mendelson

[11] 4,382,192

[45] May 3, 1983

[54] SELF-QUENCHING CIRCUIT

[75] Inventor: Robert M. Mendelson, Murray Hill, N.J.

[73] Assignee: RCA Corporation, New York, N.Y.

[21] Appl. No.: 211,342

[22] Filed: Nov. 28, 1980

[51] Int. Cl.³ .......................................... H03K 17/26
[52] U.S. Cl. ................. 307/141.4; 307/592; 315/360
[58] Field of Search ............. 307/141.4, 134, 141, 307/592, 593, 597, 599; 315/360

[56] References Cited

U.S. PATENT DOCUMENTS

| | | | |
|---|---|---|---|
| 3,559,072 | 1/1971 | Davisson | 307/599 X |
| 3,644,793 | 2/1972 | Ilk | 307/141.4 X |
| 3,745,382 | 7/1973 | Hoge et al. | 307/599 |
| 4,204,149 | 5/1980 | Cleary et al. | 307/141.4 X |
| 4,321,447 | 3/1982 | Lamb | 307/141.4 X |

*Primary Examiner*—G. Z. Rubinson
*Assistant Examiner*—James L. Dwyer
*Attorney, Agent, or Firm*—Joseph S. Tripoli; Henry I. Schanzer

[57] ABSTRACT

A switch, when closed, provides a low impedance conduction path for power being applied to a load and for the operating potential for a control circuit. The control circuit includes timing circuitry which produces a timing signal, a given time after the switch is closed. The timing signal is then used to turn-off the switch causing power to be removed from the load and the control circuit.

14 Claims, 2 Drawing Figures

_SELF-QUENCHING CIRCUIT_

SELF-QUENCHING CIRCUIT

This invention relates to circuits for controlling the application of power to a load.

In many applications it is desirable to have a circuit control the application of power to a load for a predetermined length of time. When no power is applied to the load (i.e. the load is not energized or driven) it is desirable that the circuit dissipate no power. This increases the efficiency, safety and reliability of the system. Although the circuit is to be turned-off and dissipate little or no power when the load is not driven, it is desirable that the circuit be easily turned-on when needed. This is accomplished in circuits embodying the invention.

Circuits embodying the invention include a switch connected between a first point of operating potential and an intermediate point. A load and a control circuit are connected in parallel between the intermediate point and a second point of operating potential. The switch, when turned-on, provides a low impedance path between the first and the intermediate points, whereby a voltage applied across the first and second points is applied across the load and control circuits. The control circuit, powered by the voltage developed between the intermediate and second points, includes a timing circuit which produces a timing signal a given time after the turn-on of the switch. The timing signal is then used to generate a pulse to turn-off the switch which remains turned-off until the application thereto of a subsequent turn-on signal.

Figure 1:
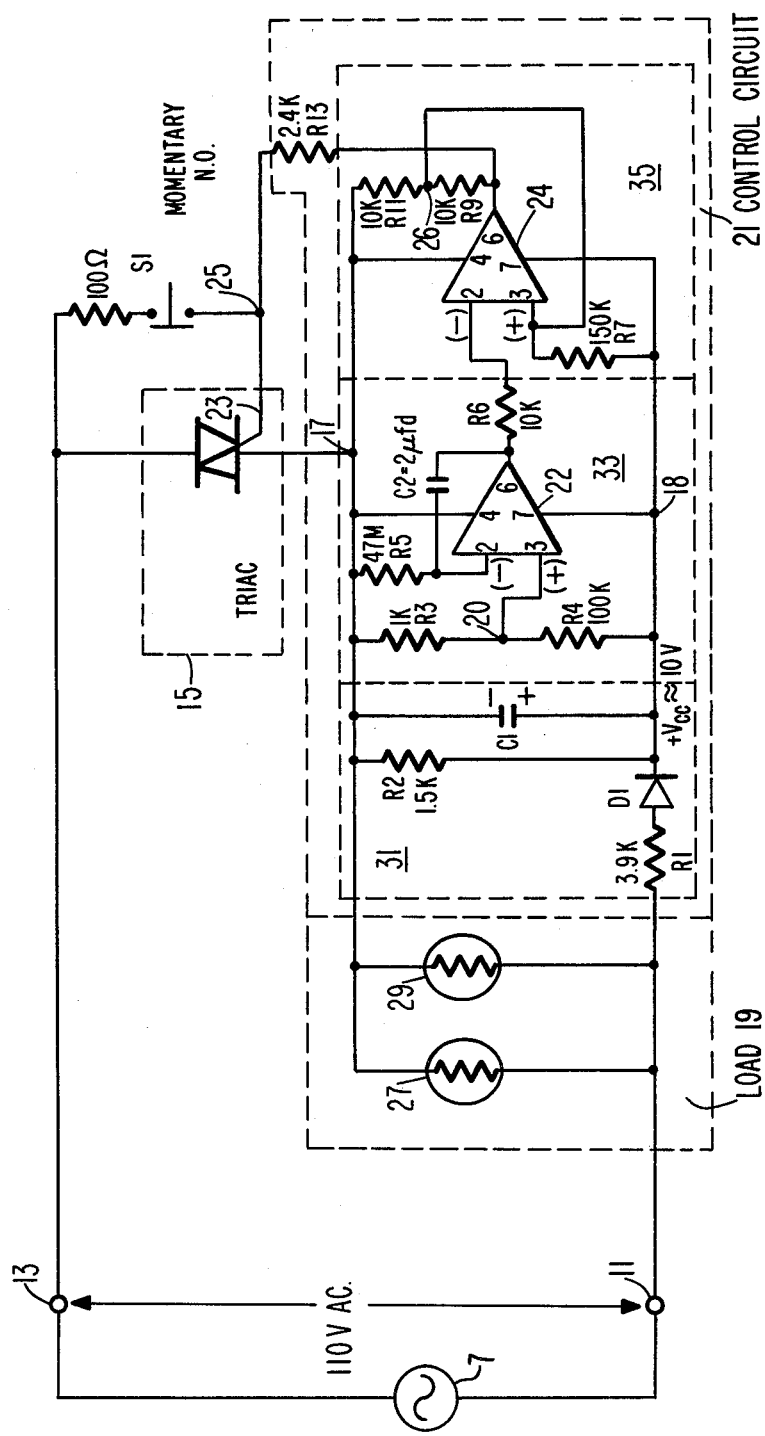
Figure 2:
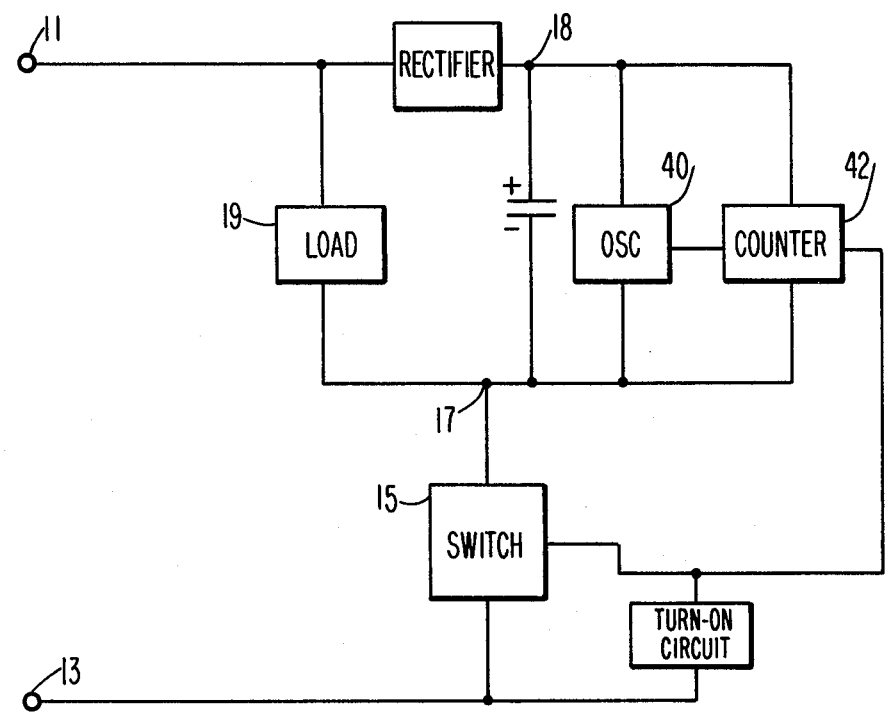

In the accompanying drawing like reference characters denote like components; and FIG. 1 is a partial schematic partial block diagram of a circuit embodying the invention; and FIG. 2 is a diagram of another circuit embodying the invention.

The circuit of FIG. 1 includes a source 7 of alternating current (AC), such as a 110 volt source, connected between power terminals 11 and 13. The circuit also includes a switch circuit 15 which, when turned-on, provides a low impedance path between terminals 13 and an intermediate terminal 17, a load circuit 19 connected between terminals 17 and 11, and a control circuit 21 also connected between terminals 17 and 11.

The switch circuit 15 is comprised of a TRIAC having its main conduction path connected between terminals 13 and 17 and a control electrode (gate) 23 connected to a node 25. The TRIAC is a gate controlled silicon AC switch that can switch from an off-state to an on-state for either polarity of applied voltage with positive or negative gate triggering voltages. The TRIAC may be, for example, a T2300 manufactured by RCA Corporation or any like device. The TRIAC may be replaced by two Silicon Controlled Rectifiers (SCR's) connected in parallel for full wave rectification. Node 25 is connected to one end of a normally open (N.O.) momentary switch S1 whose other end is connected via a 100 ohm resistor to terminal 13. Node 25, and hence gate 23, is also connected via a resistor R13 to the output terminal 6 of a comparator 24 in control circuit 21.

The load circuit connected between terminals 17 and 11 includes a lamp 27 to indicate when power is applied to the load and a heater 29. The heater may be, for example, a coil wrapped around a container to warm its contents, or any other utilization device which it is desired to energize or operate for a predetermined time from the source 7.

The control circuit 21 inludes a half wave rectifier circuit 31 to produce a direct current (DC) voltage between terminals 18 and 17, with the voltage ($V_{CC}$) at terminal 18 being positive with respect to the voltage at terminal 17. Half wave rectification is obtained by means of a diode D1 connected in series with a current limiting resistor R1 between input terminal 11 and terminal 18. Resistor R2 connected between terminals 17 and 18 functions together with R1 to establish the desired voltage. The values of R1 and R2 were chosen to produce a DC voltage of approximately 10 volts between terminals 18 and 17. A capacitor C1 connected in parallel with R2 functions to filter the DC voltage developed between terminals 17 and 18.

The control circuit 21 also includes an integrator circuit 33 and a comparator circuit 35 which are powered by the DC voltage developed between terminals 17 and 18.

The integrator includes an operational amplifier 22 and the comparator includes an operational amplifier 24. By way of example, amplifiers 22 and 24 are selected to be of the CA3160 types manufactured by RCA Corporation but, any other suitable operational amplifier could be used instead. Power terminals 4 and 7 of amplifiers 22 and 24 are connected to terminals 17 and 18 respectively. The non-inverting terminal 3 of OP AMP 22 is connected to a node 20 to which is connected resistors R3 and R4. The other end of resistor R3 is connected to terminal 17 and the other end of resistor R4 is connected to terminal 18. The inverting terminal 2 of amplifier 22 is connected to one end of a resistor R5 and an integrating capacitor C2. The other end of R5 is connected to terminal 17 and the other end of C2 is connected to output terminal 6 of amplifier 22. Amplifier 22 is connected as an integrator to function as a timing circuit.

The output of amplifier 22 is connected to the inverting terminal (2) of amplifier 24. The non-inverting terminal 3 of amplifier 24 is connected to one end of a resistor R7 and to terminal 26 to which is connected one end of resistors R9 and R11. The other end of R7 is connected to terminal 18 while the other end of resistor R11 is connected to terminal 17 and the other end of R9 is connected to output terminal 6 of amplifier 24. The output 6 of amplifier 24 is connected via resistor R13 to the gate 23 of the TRIAC.

The TRIAC 15 does not conduct (except for leakage which is small and, therefore, ignored for purpose of this discussion) until the momentary switch S1 is closed. Hence, until S1 is closed, the load 19 and control circuit 21 dissipate no power.

As soon as S1 is closed, the TRIAC is turned-on and the voltage at terminal 13 is coupled, and applied, to terminal 17 via the low ON impedance of the TRIAC. The loads 27 and 29 are then connected via the TRIAC's low ON impedance between terminals 11 and 13 and are fully energized. Concurrently, a DC voltage is generated by means of the rectifying circuitry 31 such that the voltage at terminal 18 is approximately 10 volts more positive than the voltage at terminal 17. When the TRIAC is first turned-on and a DC voltage between terminals 17 and 18 is produced, the output (6) of integrator 22 is close to zero volts (actually 0.1 volts as discussed below) and the output 6 of amplifier 24 is close to +10 volts. This +10 volts is applied via R13 to the gate of the TRIAC and maintains it on. Consequently, from the time the TRIAC is first turned-on a turn-on voltage is fed back to its gate 23 to maintain it conducting and to ensure that the TRIAC comes on each time the AC voltage swings down through zero. [With gate 23 kept positive the switch TRIAC 15 will turn on again as soon as the AC voltage swings greater than 1.5 volts of either polarity. Thus, the TRIAC 15 is on for most of the AC cycle.] When the TRIAC is turned-on, the voltage at node 20 which is applied to the non-inverting input 3 of amplifier 22 is approximately 0.10 volt due to the voltage divider action of R4 and R3; where R3 is 1K ohms and R4 is 100K ohms. The voltage at inverting terminal 2 of amplifier 22 is set close to 0.1 volt and this volage is applied across resistor R5 which in this instance has a value of 47 megohms. Accordingly, a current of approximately 2 nanoamperes flows through the resistor. This current is equal to the charging current through capacitor C2 and causes the voltage at the output 6 of amplifier 22 to increase. Note that initially (when the TRIAC is first turned-on) the voltage at pin 6 of amplifier 22 was also equal to 0.1 volt. Assuming the charging current I to be a constant and capacitor C2 to be a constant of value C, the change in voltage $\Delta V$ at output 6 may be expressed as follows:

$$\Delta V = (I/C) \cdot T \qquad \text{eq. 1}$$

where T is equal to the time duration after the application of the operating voltage to the integrator 33.

The voltage at terminal 6 of amplifier 22 thus increases from its initial value (assumed to be 0.1 volt) at the rate determined by equation 1. The voltage at the output 6 of amplifier 22 is applied via resistor R6 to the inverting input terminal 2 of amplifier 24 which functions as a comparator circuit. The output voltage of amplifier 24 is initially close to +10 volts (with respect to the voltage at terminal 17) and remains at that level until the voltage applied to its pin 2 becomes more positive than the voltage at its pin 3. The voltage at pin 3 is a function of the voltage at node 26 which is a function of the ratio of R9 to R11. Where R9 is made equal to R11, the voltage at node 26 and at pin 3 of amplifier 24 is initially equal to +5 volts with respect to the zero DC voltage at terminal 17. (This value is arbitrarily selected and could, in fact, be any voltage greater than 0.1 volt and less than 10 volts). When the voltage at pin 2 of amplifier 24 which is the voltage derived from the output of the integrator becomes more positive than the voltage at pin 3 of amplifier 24, the inverting effect of amplifier 24 causes the voltage its at pin 6 to go to ground. When the voltage at pin 6 of amplifier 24 goes to ground, the voltage which is applied via resistor R13 to the control electrode also goes to ground. When the AC voltage at terminal 13 goes to zero, the TRIAC turns off. Once the TRIAC is turned-off it will remain off until a subsequent turn-on signal is applied to its gate.

When, and as soon as the TRIAC turns off, the return for the lamp and heater circuit to terminal 13 is removed and the lamp and heater circuit turn-off. Likewise the return for the rectified supply is also removed and the voltage between terminals 17 and 18 quickly goes to zero. Capacitor C1 discharges very quickly to 0 via resistor R2, the load circuitry, and the other resistive components connected between terminals 17 and 18. When the TRIAC is turned-off, no current (except for leakage) flows in the control circuit and in the load.

The TRIAC no longer conducts and there is substantially no power dissipation in the system.

R7 connected between terminal 18 and non-inverting terminal 3 of amplifier 24 ensures that pin 3 of 24 is more positive than pin 2 of amplifier 24 at the instant when the TRIAC is first turned-on. As soon as the 10 volts DC is established, pin 3 of amplifier 24 goes to the 5 volts produced at terminal 26. This is the stable condition during the ON state of the TRIAC. Once pin 3 of 24 is at 5 volts, R7 has little effect, if any.

Resistor R13 connected between the output 6 of the comparator 24 and gate 23 of the TRIAC prevents excessive loading. At start-up when switch S1 is first closed, pin 6 of 24 is at zero volts. If the gate of the TRIAC were connected via a short circuit to pin 6 of 24, the gate of the TRIAC might not be able to be driven sufficiently positive to trigger the TRIAC into conduction.

Subsequently, when the TRIAC is turned-on the gate voltage could prevent the output of the comparator from rising to the 10 volt level. Hence, resistor R13 provides some isolation between the voltage at the gate of the TRIAC and the comparator output, while still enabling the latter to maintain the TRIAC turned-on during the ON period and to provide a sufficiently large [turn-off] pulse to the TRIAC when the output goes to zero to insure quick turn-off of the TRIAC.

It should be evident that different values of capacitance and resistance can be used to provide different values of timing so that the length of the timer may be changed or altered. It should also be evident that different devices may be used for the timer. The invention has been illustrated using operational amplifiers for the integrator and the comparator. But, it should be evident that other devices could be used instead, as shown in FIG. 2.

In the circuit of FIG. 2 a switch 15 which could be a TRIAC or any other suitable type of controllable switch is used. The load 19 may be, as in FIG. 1, any utilization device to which power is selectively applied for a given time. The control circuitry which maintains the switch 15 conducting once a turn-on signal is applied for a given period of time includes an oscillator 40 and counter circuit 42. The oscillator is activated following the turn-on of the switch when a DC voltage is generated between terminals 17 and 18. The counter 42 counts to a predetermined count and then provides a turn-off pulse to the switch. Until the predetermined count is reached, the counter provides a signal to the switch insuring that it stays conducting.

What is claimed is:

1. The combination comprising:
   first and second terminals for an operating potential;
   a switch means having a main conduction path connected between one of said first and second terminals and an intermediate circuit point, said switch means having a control means to which a turn-on or a turn-off signal may be applied;
   a load and a control circuit;
   turn-on means, independent of said control circuit, coupled between one of said first and second terminals and said control means, for selectively applying a turn-on signal to said control means to render said switch means conductive;
   means connecting said load in parallel with said control circuit between said intermediate circuit point and the other one of said first and second terminals said control circuit and said load being powered solely when said switch means is turned-on;

said control circuit including timing circuitry for producing a timing signal a given time after said switch means is turned-on; and means responsive to said timing signal connected to said control means of said switch means for turning off said switch means completely, thereby removing the power from said load and to said control circuit until said turn-on means renders said switch means conductive.

2. The combination as claimed in claim 1 wherein said operating operating potential is a source of alternating voltage; and wherein said switch means includes first and second main electrodes defining the ends of said main conduction path, wherein said switch means can conduct bidirectionally in response to a signal of greater than given amplitude applied between said control means and said second main electrode; and wherein said first main electrode is connected to said one of said first and second terminals and wherein said second main electrode is connected to said intermediate circuit point.

3. The combination as claimed in claim 2 wherein said switch means is a TRIAC.

4. The combination as claimed in claim 3 wherein said load includes a heater circuit.

5. The combination as claimed in claim 3 wherein said control circuit includes a rectifying circuit for converting the alternating voltage to a direct voltage to provide the operating potential for said control circuit.

6. The combination as claimed in claim 5 wherein said timing circuit is an integrator having an output at which said timer signal is produced, and wherein said control circuit includes a comparator circuit connected at one input to the integrator output, said comparator circuit having an output connected to the control means of said TRIAC.

7. The combination as claimed in claim 6 wherein said comparator circuit includes means for producing at its output a signal level applied to the control means of said TRIAC for applying a turn-on signal to the latter during said given time.

8. The combination as claimed in claim 1 wherein said turn-on means is coupled between said control means and said one of said first and second terminals and applies a momentary turn-on signal to said control means and wherein said control circuit includes means coupled to said control means for applying a continuous turn-on signal to said switch means during said given time.

9. The combination as claimed in claim 1 wherein said timing circuitry for producing a timing signal includes an oscillator and a counter.

10. The combination comprising:

first and second terminals for an operating potential;

a switch means having a main conduction path connected between one of said first and second terminals and an intermediate circuit point, said switch means having a gating means to which a turn-on or a turn-off signal may be applied;

a load and a control circuit;

turn-on means, independent of said control circuit, coupled between one of said first and second terminals and said gating means, for selectively applying a momentary turn-on signal to said gating means to render said switch means conductive;

means connecting said load and said control circuit between said intermediate circuit point and the other one of said first and second terminals for generating and applying an enabling operating potential to said control circuit and for applying full power to said load solely when said switch means is turned-on; and said control circuit including timing circuitry coupled between said intermediate circuit point and said gating means for maintaining said switch means conductive for a given time period after said switch means is turned-on and then placing said gating means at a potential having a polarity and magnitude to turn-off said switch means completely and thereby removing the application of power to said control circuit until said turn-on means again renders said switch means conductive.

11. The combination comprising:

first and second terminals for an operating potential;

a semiconductor switch means having a main conduction path connected between said first terminal and an intermediate circuit point, said switch means having a control electrode to which a turn-on or a turn-off signal may be applied;

a load and a control circuit;

turn-on means independent of said control circuit coupled between said first terminal and said control electrode for selectively applying a turn-on signal to said control electrode to render said switch means conducting;

means connecting said load between said intermediate circuit point and said second terminal, said load being fully powered solely when said switch means is turned-on;

means connecting said control circuit between said intermediate circuit point and said second terminal, said control circuit including means for generating an enabling operating potential for said control circuitry solely when said switch means is turned-on; and said control circuit including timing circuitry coupled between said intermediate circuit point and said control electrode for maintaining said switch means conductive for a given time period after said switch means is turned-on and then placing said control electrode at a potential having a polarity and magnitude to turn-off said switch means completely and removing the application of power to said load and the application of an operating potential to said control circuit until said turn-on means again renders said switch means conductive.

12. The combination as claimed in claim 11 wherein said timing circuitry for maintaining said switch means conductive includes means for applying a direct current turn-on voltage to said control electrode during said given time period.

13. The combination as claimed in claim 11 wherein said timing circuitry for placing said control electrode at a potential having a polarity and magnitude to turn-off said switch includes means for applying to the control electrode a potential approximately equal to that at said intermediate circuit point.

14. The combination comprising:

first and second terminals for an alternating current (AC) operating potential;

a semiconductor switch means having a main conduction path connected between said first terminal and an intermediate circuit point, said switch means having a control electrode to which a turn-on or a turn-off signal may be applied;

means for selectively applying a momentary turn-on signal to said control electrode for selectively turning-on said switch means;

means connecting a load between said intermediate circuit point and said second terminal, said load being fully powered solely when said switch means is turned-on;

a rectifying circuit connected between said intermediate circuit point and said second terminal for generating a direct current (D.C.) operating potential of given value solely when said switch means is turned-on;

a control circuit;

means applying said D.C. operating potential to said control circuit; and said control circuit including timing circuitry coupled between said intermediate circuit point and said control electrode of said switch means for applying a D.C. turn-on voltage to said control electrode for a predetermined period of time following the application of said momentary turn-on signal thereby maintaining said switching means conductive for said predetermined period, and for then placing the control electrode at approximately the same potential as that at said intermediate circuit point for turning-off said switch means and thereby removing power from said load, and discontinuing the generation of said D.C. operating potential and its application to said control circuit until the next turn-on signal.

* * * * *